(12) United States Patent
Yamamoto

(10) Patent No.: US 7,967,275 B2
(45) Date of Patent: Jun. 28, 2011

(54) HARD FILM AND HARD FILM-COATED MATERIAL

(75) Inventor: Kenji Yamamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 647 days.

(21) Appl. No.: 11/767,100

(22) Filed: Jun. 22, 2007

(65) Prior Publication Data

US 2008/0038503 A1  Feb. 14, 2008

(30) Foreign Application Priority Data

Aug. 9, 2006  (JP) ................................ 2006-217266
Nov. 2, 2006  (JP) ................................ 2006-299268

(51) Int. Cl.
*B32B 9/00* (2006.01)

(52) U.S. Cl. ................... 249/134; 106/38.22; 164/485; 428/336; 428/697; 428/698; 428/699

(58) Field of Classification Search .............. 428/336, 428/697, 698, 699, 701, 702, 704; 106/38.22; 164/485; 249/134
See application file for complete search history.

(56) References Cited

U.S. PATENT DOCUMENTS

| | | | | |
|---|---|---|---|---|
| 5,580,653 A * | 12/1996 | Tanaka et al. | | 428/699 |
| 5,656,383 A * | 8/1997 | Tanaka et al. | | 428/697 |
| 5,882,778 A * | 3/1999 | Sugizaki et al. | | 428/336 |
| 6,296,928 B1 * | 10/2001 | Yamada et al. | | 428/216 |
| 7,258,912 B2 | 8/2007 | Yamamoto et al. | | |
| 2010/0129644 A1 * | 5/2010 | Endrino | | 428/697 |

FOREIGN PATENT DOCUMENTS

| | | |
|---|---|---|
| EP | 0 416 887 | 3/1991 |
| JP | 6-41720 | 2/1994 |
| JP | 10-237628 | 9/1998 |
| JP | 2000-1768 | 1/2000 |
| JP | 2000-144376 | 5/2000 |
| JP | 2002-160129 | * 6/2002 |
| JP | 2002-307128 | 10/2002 |
| JP | 2002-307129 | 10/2002 |
| JP | 2005-213637 | 8/2005 |
| JP | 2005-256081 | 9/2005 |
| JP | 2005-279811 | 10/2005 |
| WO | WO 2005/005110 | 1/2005 |
| WO | WO 2006/084404 | 8/2006 |

OTHER PUBLICATIONS

U.S. Appl. No. 11/756,014, filed May 31, 2007, Yamamoto, et al.
U.S. Appl. No. 12/494,784, filed Jun. 30, 2009, Yamamoto, et al.
Fox-Rabinovich, G.S. et al, "Self-adaptive wear behavior of nano-multilayered TiAlCrN/WN coatings under severe machining conditions". Surface & Coatings Technology, 2006, vol. 201, pp. 1852-1860.
Office Action issued Oct. 26, 2010 in JP Application No. 2006-299268 (With English Translation).

* cited by examiner

*Primary Examiner* — Archene Turner
(74) *Attorney, Agent, or Firm* — Oblon, Spivak, McClelland, Maier & Neustadt, L.L.P.

(57) ABSTRACT

A hard film and a hard film-coated material having better wear resistance and sliding performance (due to lower friction coefficients) than conventional surface coating layers, wherein the hard film includes at least one covering layer A and at least one covering layer B stacked one over the other, both having a thickness of 5 to 100 nm. The covering layer has a composition represented by the formula $M(B_a C_b N_{1-a-b})$, where M denotes one or more elements selected from W, V, Mo, and Nb, and a and b denote the atomic ratio of B and C, respectively, as defined below. $0 \leq a \leq 0.3$ ... (1A), and $0 \leq b \leq 0.5$ ... (2A). Covering layer B has a composition represented by the formula $Ti_{1-x-y}Cr_x Al_y Si_z(C_{1-A} N_A)$ where x, y, z, and A denote the atomic ratio of Cr, Al, Si, and N, respectively, as defined below. $0 \leq 1-x-y \leq 0.5$ ... (1B), $0 \leq x \leq 0.5$ ... (2B), $0.4 \leq y \leq 0.7$ ... (3B), $0 \leq z \leq 0.15$ ... (4B), and $0.5 \leq A \leq 1$ ... (5B).

17 Claims, No Drawings

HARD FILM AND HARD FILM-COATED MATERIAL

BACKGROUND OF THE INVENTION

1. Field of the Invention

The present invention relates to a technology for a hard film and a hard film-coated material.

2. Description of the Related Art

Nitriding has been a common practice to improve molds and jigs (for metal working) in wear and seizure resistance. Further improvement in this area is being attempted by replacing nitriding with gas phase coating (such as PVD), as disclosed in the following Patent Documents. Patent Document 1 discloses improvement in sliding performance by coating with a compound nitride containing more than one element selected from Cr, Al, Ti, and V. Patent Documents 2 and 3 disclose a mold with good wear or seizure resistance which is coated with a layer of nitride, carbide, or carbonitride containing at least one element selected from Ti, V, Al, Cr, and Si and an optional additional layer of molybdenum sulfide containing some Ti and/or Cr sulfide. Patent Document 4 discloses a surface coating consisting of hard nitride and $MoS_2$ formed thereon for good wear and seizure resistance.

Patent Document 1:
  Japanese Patent Laid-open No. 2000-144376
Patent Document 2:
  Japanese Patent Laid-open No. 2002-307128
Patent Document 3:
  Japanese Patent Laid-open No. 2002-307129
Patent Document 4:
  Japanese Patent Laid-open No. 2000-1768

OBJECT AND SUMMARY OF THE INVENTION

Despite its high hardness and good wear resistance, the compound nitride (containing more than one element selected from Cr, Al, Ti, and V) as disclosed in Patent Document 1 lacks sufficient seizure resistance required for plastic working under harsh conditions with a high surface pressure. This is true also for the nitride, carbide, or carbonitride (containing more than one element selected from Ti, V, Al, Cr, and Si) as disclosed in Patent Document 2. The sulfide disclosed in Patent Documents 3 and 4, which was developed for improvement in seizure resistance, lacks long-term durability because it is soft and initially exhibits good sliding performance but easily wears out with time.

The present invention was completed to address the above-mentioned problems. It is an object of the present to provide a hard film and a hard film-coated material having better wear resistance and sliding performance (due to lower friction coefficients) than conventional surface coating layers.

The first aspect of the present invention resides in a hard film which includes at least one covering layer A and at least one covering layer B stacked one over the other, both having a thickness of 5 to 100 nm and a composition represented by the formula below.

Composition of covering layer A: $M(B_aC_bN_{1-a-b})$
where, M denotes one or more elements selected from W, V, Mo, and Nb, and a and b denote the atomic ratio of B and C, respectively, as defined below.

$$0 \leq a \leq 0.3 \quad (1A)$$

$$0 \leq b \leq 0.5 \quad (2A)$$

Composition of covering layer B: $Ti_{1-x-y}Cr_xAl_ySi_z(C_{1-A}N_A)$
where, x, y, z, and A denote the atomic ratio of Cr, Al, Si, and N, respectively, as defined below.

$$0 \leq 1-x-y \leq 0.5 \quad (1B)$$

$$0 \leq x \leq 0.5 \quad (2B)$$

$$0.4 \leq y \leq 0.7 \quad (3B)$$

$$0 \leq z \leq 0.15 \quad (4B)$$

$$0.5 \leq A \leq 1 \quad (5B)$$

The second aspect of the present invention resides in a specific embodiment of the hard film according to the first aspect in which covering layer A contains V as M and does not contain B (with a=0) and covering layer B has x, y, z, and A as defined below by equations (1C) to (5C) or (1D) to (5D).

$$0 \leq 1-x-y \leq 0.3 \quad (1C)$$

$$0.1 \leq x \leq 0.3 \quad (2C)$$

$$0.5 \leq y \leq 0.7 \quad (3C)$$

$$z=0 \quad (4C)$$

$$A=1 \quad (5C)$$

$$0 \leq 1-x-y \leq 0.3 \quad (1D)$$

$$0.1 \leq x \leq 0.3 \quad (2D)$$

$$0.5 \leq y \leq 0.65 \quad (3D)$$

$$0.01 \leq z \leq 0.1 \quad (4D)$$

$$A=1 \quad (5D)$$

The third aspect of the present invention resides in a hard film-coated material which includes a steel substrate and a hard film formed thereon, which is defined in the first or second aspect of the present invention, with a covering layer C interposed between them, the covering layer C being thicker than 5 μm and having a composition represented by the formula below.

Composition of covering layer C: $(Cr_aM_{1-a})(Cr_{1-y}N_y)$
where, M denotes one or more elements selected from Ti, Al, Nb, W, Mo, and Si, and a and y denote the atomic ratio of Cr and N, respectively, as defined below.

$$0.2 \leq a \quad (1E)$$

$$0 \leq y \leq 1 \quad (2E)$$

The present invention is based on the following finding arising from the present inventors' intensive studies. A coating film exhibits good sliding performance (or has low friction as well as good wear resistance) if it is comprised of two layers stacked one over the other, the first layer being formed from a compound of (W, Mo, V, Nb) (BCN) which is composed of one or more elements selected from W, Mo, V, and Nb and one or more elements selected from B, C, and N, and the second layer being formed from a compound of TiCrAlSi (CN). The compound (W, Mo, V, Nb)(BCN) gives rise to low-melting oxides of W, Mo, V, and Nb through the tribochemical reaction which is induced by frictional heat and surface pressure at the time of sliding. This causes the first layer to exhibit a low frictional coefficient. Unfortunately, the tribochemical reaction at a high temperature causes oxidation to proceed rapidly, which leads to excessive wear. This problem is solved by covering the first layer with the second layer of TiCrAlSi(CN) excelling in oxidation resistance. The hard film of dual layer structure avoids rapid oxidation at a high temperature and retains a low friction coefficient.

The compound (W, Mo, V, Nb)(BCN) may contain any one or more elements selected from W, Mo, V, and Nb. Selection depends on the temperature of working because these elements give oxides with different melting points (shown below) at the time of sliding.

$Nb_2O_5$: 1460, $WO_3$: 1400° C., $MoO_3$: 800° C., $V_2O_5$: 685° C.

N is an essential element because it forms a hard nitride with M (representing any one or more species of W, Mo, V, and Nb). The atomic ratio of N should preferably be no less than 0.2, more preferably no less than 0.5, depending on the atomic ratio of B and C. ("Atomic ratio" will be simply referred to as "ratio" hereinafter.) B combines with N to form B—N bonds in the film, thereby improving lubricating performance, and also combines partly with M to form hard borides. Therefore, B contributes to wear resistance and seizure resistance. The ratio of B should preferably be no less than 0.05, more preferably no less than 0.1. The ratio of B should preferably be lower than 0.3, more preferably lower than 0.2, because excessive B causes soft BN compounds to be dominated therein.

C combines with M to form a hard carbide, thereby contributing to higher hardness. The ratio of C should preferably be no less than 0.05 and no more than 0.5, preferably no more than 0.3, and more preferably no more than 0.2. Excessive C remains free without combination with M.

Al in the TiCrAlSi(CN) layer is essential because it imparts oxidation resistance to the film. Cr is an optional element to be added for improvement in oxidation resistance. The ratio of Cr should be lower than 0.5, preferably 0.05 to 0.4, and more preferably 0.2 to 0.4, because excessive Cr relatively reduces the Al content and deteriorates oxidation resistance. The ratio of Al should be 0.4 to 0.7, preferably 0.5 to 0.65. Al in a ratio lower than 0.4 is not enough for good oxidation resistance and Al in a ratio more than 0.7 undergoes transition into a soft hexagonal compound. The ratio of Ti should be lower than 0.5 for film with high hardness. Excessive Ti markedly deteriorates oxidation resistance. In the case where Cr is added, the ratio of Ti should be lower than 0.3, preferably lower than 0.25. The ratio of Si should be lower than 0.15, preferably lower than 0.1, for improvement in oxidation resistance. Excessive Si tends to decrease the film hardness. The amounts of Al and Si should be controlled such that the ratio of Al plus the ratio of Si is lower than 0.7; otherwise, the resulting film has a soft hexagonal crystal structure. N is an essential element, and the ratio of N should be higher than 0.5. The ratio of C should be lower than 0.5, preferably lower than 0.3. Although C contributes to hardness and lubricating performance, excessive C markedly deteriorates oxidation resistance.

The hard film according to a first aspect of the present invention, which was completed based on the foregoing finding, includes covering layer A and covering layer B stacked one over the other, both having a thickness of 5 to 100 nm and a composition represented by the formula below. Composition of covering layer A: $M(B_aC_bN_{1-a-b})$ where, M denotes one or more elements selected from W, V, Mo, and Nb, and a and b denote the atomic ratio of B and C, respectively, as defined below.

$$0 \leq a \leq 0.3 \tag{1A}$$

$$0 \leq b \leq 0.5 \tag{2A}$$

Composition of covering layer B: $Ti_{1-x-y}Cr_xAl_ySi_z(C_{1-A}N_A)$ where, x, y, z, and A denote the atomic ratio of Cr, Al, Si, and N, respectively, as defined below.

$$0 \leq 1-x-y \leq 0.5 \tag{1B}$$

$$0 \leq x \leq 0.5 \tag{2B}$$

$$0.4 \leq y \leq 0.7 \tag{3B}$$

$$0 \leq z \leq 0.15 \tag{4B}$$

$$0.5 \leq A \leq 1 \tag{5B}$$

The hard film according to the aspect is composed of covering layer A and covering layer B, both having a thickness of 5 to 100 nm. With a thickness larger than 100 nm, covering layer A dominates over covering layer B, thereby preventing the hard film from exhibiting its desired performance due to layer stacking. By contrast, a thickness smaller than 5 nm is not enough for covering layer A to produce its effect. Likewise, with a thickness larger than 100 nm, covering layer B dominates over covering layer A, thereby preventing the hard film from exhibiting its desired performance due to layer stacking. By contrast, a thickness smaller than 5 nm is not enough for covering layer B to produce its effect. For the reasons mentioned above, covering layer A should have a thickness smaller than 50 nm, preferably smaller than 20 nm, and covering layer B should have a thickness smaller than 50 nm, preferably smaller than 20 nm.

Covering layer A should have an atomic ratio (a) for B in the range of $0 \leq a \leq 0.3$. This is because covering layer A with an atomic ratio (a) larger than 0.3 is poor in hardness and wear resistance on account of soft BN compounds dominating therein. Also, covering layer A should have an atomic ratio (b) for C in the range of $0 \leq b \leq 0.5$. This is because covering layer A with an atomic ratio (b) larger than 0.5 is poor in wear resistance on account of free C remaining therein without combination with M.

Covering layer B should have an atomic ratio (1−x−y) for Ti in the range of $0 \leq 1-x-y \leq 0.5$. This is because covering layer B with an atomic ratio (1−x−y) larger than 0.5 is poor in oxidation resistance. Covering layer B should have an atomic ratio (x) for Cr in the range of $0 \leq x \leq 0.5$. This is because covering layer B with an atomic ratio (x) larger than 0.5 is poor in oxidation resistance because excessive Cr relatively reduces the amount of Al. Covering layer B should have an atomic ratio (y) for Al in the range of $0.4 \leq x \leq 0.7$. This is because covering layer B with an atomic ratio (y) smaller than 0.4 is poor in oxidation resistance and covering layer B with an atomic ratio (y) lager than 0.7 is poor in hardness and wear resistance because excessive Al forms soft hexagonal compounds. Covering layer B should have an atomic ratio (z) for Si in the range of $0 \leq z \leq 0.15$. This is because covering layer B with an atomic ratio (z) larger than 0.15 is poor in hardness and wear resistance. Covering layer B should have an atomic ratio (A) for N in the range of $0.5 \leq A \leq 1$. This is because covering layer B with an atomic ratio (A) lower than 0.5 is poor in hardness and wear resistance. Covering layer B should have an atomic ratio (1−A) for C smaller than 0.5. This is because covering layer B with an atomic ratio (1−A) more than 0.5 is poor in oxidation resistance.

The hard film exhibits the most desirable sliding performance at an operating temperature of about 600° C. when the covering layer A contains V as M because V forms oxides having a lower melting point than oxides of W or Mo. The hard film containing V as M has the lowest friction coefficient and hence improved sliding performance (due to the lubricating effect of oxides of V) when it contains no B (or a=0). A probable reason for this is that V in the absence of B does not form any compound of V and B which is thermally unstable and low in hardness.

The hard film has the maximum hardness when the covering layer B has the atomic ratios defined below.

$$0.1 \leq 1-x-y \leq 0.3$$

$$0.1 \leq x \leq 0.3$$

$$0.5 \leq y \leq 0.7$$

$$z=0$$

$$A=1$$

Alternatively, $$0.1 \leq 1-x-y \leq 0.3$$

$$0.1 \leq x \leq 0.3$$

$$0.5 \leq y \leq 0.65$$

$$0.01 \leq z \leq 0.1$$

$$A=1$$

where, $1-x-y$ represents the atomic ratio of Ti, x represents the atomic ratio of Cr, y represents the atomic ratio of Al, z represents the atomic ratio of Si, and A represents the atomic ratio of N. The hard film exhibits increased hardness and improved wear resistance particularly when $0.1 \leq 1-x-y$.

For the reasons mentioned above, a second aspect of the present invention differs from the first one in that covering layer A contains V as M and contains no B (or a=0) and covering layer B satisfies the atomic ratios defined by the following equations (1C) to (5C) or (1D) to (5D). The hard film according to the second aspect of the present invention excels in wear resistance and sliding performance (due to low friction coefficient).

$$0 \leq 1-x-y \leq 0.3 \quad (1C)$$

$$0.1 \leq x \leq 0.3 \quad (2C)$$

$$0.5 \leq y \leq 0.7 \quad (3C)$$

$$z=0 \quad (4C)$$

$$A=1 \quad (5C)$$

$$0 \leq 1-x-y \leq 0.3 \quad (1D)$$

$$0.1 \leq x \leq 0.3 \quad (2D)$$

$$0.5 \leq y \leq 0.65 \quad (3D)$$

$$0.01 \leq z \leq 0.1 \quad (4D)$$

$$A=1 \quad (5D)$$

The hard film according to the present invention is a laminate film composed of covering layer A and covering layer B. That is, it is a composite material having the characteristic properties of the two covering layers. It exhibits its outstanding performance owing to their synergistic effect, which arises from the stacking of the two covering layers.

The hard film according to the present invention may be composed of one or more covering layers A and one or more covering layers B, with the total number of covering layers A and B being not specifically restricted. The larger the total number of layers, the more remarkable the effect of layer stacking. The hard film varies in quality depending on the total number of layers even though its thickness remains the same. With an extremely small total number of layers (say, two), the hard film as a whole is inhomogeneous (in composition and properties) because the covering layers A and B are unevenly distributed on the macro scale. By contrast, with a large total number of layers, the hard film as a whole is homogeneous (in composition and properties) because the covering layers A and B are evenly distributed (as if they are mixed together) on the macro scale even though they are unevenly distributed on the micro scale. Therefore, the total number of layers stacked one over another should desirably be as large as possible. Moreover, stacking many layers is an easy way to realize the hard film with a desired thickness. (It is very difficult to achieve a desired thickness with only two layers.) For the reasons mentioned above, the total number of layers should preferably be larger than 10, more preferably larger than 20.

The hard film according to the present invention is not specifically restricted in its thickness (or the total thickness of the covering layers). A thickness smaller than 0.1 μm is not enough to produce desirable wear resistance. By contrast, a thickness larger than 20 μm is detrimental to productivity (due to long coating time) without additional wear resistance and oxidation resistance. Therefore, the thickness of the hard film should preferably be smaller than 20 μm.

There is no specific order of forming the covering layers A and B on a base material (with or without an underlying layer). The process may be started and finished with either of them. In the case where the number of covering layers is extremely small, say 2 or 3, the covering layer A should be top (which has a lower friction coefficient than the covering layer B).

A third aspect of the present invention is directed to a hard film-coated material which includes a steel substrate and a hard film of the present invention formed thereon, with a covering layer C interposed between them, the covering layer C being thicker than 5 μm and having a composition represented by the formula below.

Composition of covering layer C: $(Cr_a M_{1-a})(Cr_{1-y}N_y)$ where, M denotes one or more elements selected from Ti, Al, Nb, W, Mo, and Si, and a and y denote the atomic ratio of Cr and N, respectively, as defined below.

$$0.2 \leq a \quad (1E)$$

$$0 \leq y \leq 1 \quad (2E)$$

The third aspect of the present invention is based on the finding that troubles with seizure and damage to molds can be avoided by additionally forming the covering layer C under the covering layers A and B mentioned above. Seizure and damage to molds occur at the time of pressing a high tension steel sheet at a high surface pressure with the possibility of involving foreign matter. Such troubles easily occur in a steel substrate material with low hardness. The hard film-coated material according to the third aspect of the present invention is less liable to seizure and damages due to involvement of foreign matter than the hard-film coated material (without the underlying layer) consisting of a steel substrate material and the covering layers defined above by the first or second aspect of the present invention. Therefore, it is suitable for molds and jigs.

The covering layer C should be thicker than 5 μm because a thickness smaller than 5 μm is not enough for improvement in seizure resistance. The covering layer C should contain Cr such that $0.2 \leq a$ (where a denotes the atomic ratio of Cr) for its good adhesion to the steel substrate material. The atomic ratio of Cr should preferably be larger than 0.5 for better adhesion.

The covering layer C has an increased hardness owing to M added thereto (which is at least one element selected from Ti, Al, Nb, W, Mo, and Si). Of these elements, Al, W, Ti, and Mo are particularly effective in improvement in hardness. An additional advantage of W and/or Mo added to the covering layer C is that they promote dissolution of the covering films when it is necessary to electrochemically remove partly damaged coating and perform recoating. For this reason, addition of W and/or Mo is recommended.

For good wear resistance, the covering layers A and B to be formed on the covering layer C should preferably be thicker than 3 μm, more preferably thicker than 5 μm (in total). In addition, the total thickness of the covering layers A, B, and C should preferably be larger than 10 μm.

DESCRIPTION OF THE PREFERRED EMBODIMENTS

The present invention will be described below in more detail with reference to Examples and Comparative Examples, which are not intended to restrict the scope thereof. Any modification may be made without departing from the scope of the present invention.

EXAMPLE 1

Samples of coating film listed in Tables 1 and 2, which specify the composition, the number of layers, and the thickness of coating film, were prepared by using a film-forming apparatus equipped with an arc evaporation source or a sputter evaporation source, from a target containing M (at least one species of W, V, and Mo) and optional B and a target containing at least one species of Ti, Cr, Al, and Si.

The base material for the samples is a mirror-finished cemented carbide or SKD11 (with hardness HR C60). The former is used to examine the coating film for composition and hardness, and the latter is used to examine the coating film for sliding performance at high temperatures. Film coating on the base material is accomplished in the following manner. The base material (substrate) is placed in the chamber of the film-forming apparatus. The chamber is evacuated to a pressure lower than $1 \times 10^{-3}$ Pa. The substrate heated to about 400° C. undergoes sputter cleaning with Ar ions. Film coating from an arc evaporation source is carried out with a target (100 mm in diameter) and an arc current of 150 A in an atmosphere of $N_2$ or $N_2+CH_4$ at a total pressure of 4 Pa. The covering layer B was formed first on the substrate and the covering layer A was formed last, so that the covering layer B is in direct contact with the substrate and the covering layer A is top.

The samples thus prepared were examined for composition and hardness. They were further examined for wear resistance and friction coefficient by sliding test at high temperatures.

The composition was determined by EPMA. The hardness was measured by using a micro-Vickers hardness meter under a load of 0.25 N for 15 seconds. The sliding test at high temperatures was conducted under the following conditions.
Conditions for sliding test at high temperatures:
   Apparatus: Sliding tester of vane-on-disk type
   Vane: SKD 61 steel (HRC 50)
   Disk: SKD 11 steel (HRC 60), with coating film
   Sliding speed: 0.1 m/s
   Load: 500 N
   Sliding distance: 500 m
   Test temperature: 500° C.

The results of the test are shown in Table 3 and 4. Incidentally, Tables 1 and 2 show the composition in terms of atomic ratio, the number of layers in terms of the total number of covering layers A and B, and the total film thickness in terms of the sum of thicknesses of layers constituting the hard film. (The same applies to the subsequent tables.) It is noted from Tables 1 to 4 that there is an apparent difference in sliding performance (or friction coefficient) and wear resistance (or amount of film wear) between Example and Comparative Example, with the former pertaining to the first aspect of the present invention. Samples in Example 1 are denoted by Nos. 7-12, 14-24, 26-28, 30-32, 35-37, 39-43, 45-46, and 48-50, and samples in Comparative Example are denoted by Nos. 1-5, 6, 13, 25, 29, 33, 34, 38, 44, and 47.

EXAMPLE 2

Samples of coating film listed in Table 8, which specifies the composition, the number of layers, and the thickness of coating film, were prepared and tested in the same way as in Example 1. The results of the test are shown in Table 9. It is noted from Tables 8 and 9 that there is an apparent difference in sliding performance (or friction coefficient) and wear resistance (or amount of film wear) between Example and Comparative Example, with the former pertaining to the first aspect of the present invention. Samples in Example 2 are denoted by Nos. 2d-5d, 8d-9d, and 11d, and samples in Comparative Example are denoted by Nos. 1d, 6d, 7d, and 10d. It is also noted that samples Nos. 2d-5d, 8d, 9d, and 11d in Example 2 are superior to samples Nos. 1-5, 6, 13, 25, 29, 33, 34, 38, 44, and 47 in Comparative Example shown in Tables 1 to 4.

EXAMPLE 3

Samples of coating film listed in Table 5, which specifies the composition, the number of layers, and the thickness of coating film, were prepared and tested in the same way as in Example 1. The results of the test are shown in Table 6. It is noted from Tables 5 and 6 that there is an apparent difference in sliding performance (or friction coefficient) and wear resistance (or amount of film wear) between Example and Comparative Example, with the former pertaining to the second aspect of the present invention. Samples in Example 3 are denoted by Nos. 7a, 8a, 12a, and 15a-21a, and samples in Comparative Example (which do not conform to both the first and second aspects of the present invention) are denoted by Nos. 1a-4a, 9a, and 10a. It is also noted that samples Nos. 7a, 8a, 12a, and 15a-21a in Example 3 are superior to samples Nos. 6a, 11a, 13a, and 14a in Comparative Example which conform to the first aspect of the present invention but do not conform to the second aspect of the present invention.

EXAMPLE 4

Samples of coating film consisting of covering layer A, covering layer B, and covering layer C (as the underlying layer) were prepared. First, the covering layer C having the composition and thickness specified in Table 7 was formed and then the covering layers A and B each having the composition and thickness specified in Table 7 was formed thereon in the same way as in Example 1. The number of the covering layers A and B is also shown in Table 7. The covering layer B was formed first on the covering layer C and the covering layer A was formed last, so that the covering layer B is in direct contact with the covering layer C and the covering layer A is top.

The samples thus prepared were examined for composition and hardness in the same way as in Example 1. They were further examined for seizure resistance and sliding performance at high temperatures under the following conditions.

Conditions for sliding test at high temperatures:
 Apparatus: Sliding tester of vane-on-disk type
 Vane: SKD 61 steel (HRC 50)
 Disk: SKD 11 steel (HRC 60), with coating film
 Sliding speed: 0.1 m/s
 Load: gradually increased from 500 N to 1000 N at a rate of 100 N/100 m, until seizure (starting from damage) occurred.
 Test temperature: 500° C.

The results of the test are shown in Table 7. All the samples tested have the hard film composed of the covering layers A and B which meets the requirements of the first aspect of the present invention. The hard film has the composition, the thickness, and the number of layers which are common to all the samples. It is noted that the effect of the underlying layer (covering layer C) on seizure resistance is evident by comparing the samples Nos. 3c to 12c (with the underlying layer thicker than 6 μm) with the sample No. 1C (without the underlying layer). It is also noted that the effect on seizure resistance varies depending on the thickness if the composition is the same. The sample No. 2 (with underlying layer) merely has the same level of seizure resistance as the sample No. 1 (without underlying layer) because the former meets the requirement of the third aspect of the present invention with respect to composition but not thickness (larger than 5 μm).

TABLE 1

| Nº | Film forming method | Layer A Composition (atomic ratio) |  |  |  |  |  | Thickness nm | Layer B Composition (atomic ratio) |  |  |  |  |  | Thickness nm | Number of layers | Total layer thickness nm |
|---|---|---|---|---|---|---|---|---|---|---|---|---|---|---|---|---|---|
|  |  | V | W | Mo | B | C | N |  | Ti | Cr | Al | Si | C | N |  |  |  |
| 6  | AIP | 1   | 0   | 0   | 0    | 0   | 1.00 | 2   | 0.2  | 0.2  | 0.55 | 0.05 | 0 | 1.00 | 2   | 750 | 3000 |
| 7  | AIP | 1   | 0   | 0   | 0    | 0   | 1.00 | 5   | 0.2  | 0.2  | 0.55 | 0.05 | 0 | 1.00 | 5   | 300 | 3000 |
| 8  | AIP | 1   | 0   | 0   | 0    | 0   | 1.00 | 20  | 0.2  | 0.2  | 0.55 | 0.05 | 0 | 1.00 | 20  | 75  | 3000 |
| 9  | AIP | 1   | 0   | 0   | 0    | 0   | 1.00 | 30  | 0.2  | 0.2  | 0.55 | 0.05 | 0 | 1.00 | 30  | 50  | 3000 |
| 10 | AIP | 1   | 0   | 0   | 0    | 0   | 1.00 | 50  | 0.2  | 0.2  | 0.55 | 0.05 | 0 | 1.00 | 50  | 30  | 3000 |
| 11 | AIP | 1   | 0   | 0   | 0    | 0   | 1.00 | 80  | 0.2  | 0.2  | 0.55 | 0.05 | 0 | 1.00 | 80  | 18  | 3000 |
| 12 | AIP | 1   | 0   | 0   | 0    | 0   | 1.00 | 100 | 0.2  | 0.2  | 0.55 | 0.05 | 0 | 1.00 | 100 | 15  | 3000 |
| 13 | AIP | 1   | 0   | 0   | 0    | 0   | 1.00 | 150 | 0.2  | 0.2  | 0.55 | 0.05 | 0 | 1.00 | 150 | 10  | 3000 |
| 14 | AIP | 1   | 0   | 0   | 0.1  | 0   | 0.90 | 30  | 0.2  | 0.2  | 0.55 | 0.05 | 0 | 1.00 | 30  | 50  | 3000 |
| 15 | AIP | 1   | 0   | 0   | 0.2  | 0   | 0.80 | 30  | 0.2  | 0.2  | 0.55 | 0.05 | 0 | 1.00 | 30  | 50  | 3000 |
| 16 | AIP | 1   | 0   | 0   | 0    | 0.2 | 0.80 | 30  | 0.2  | 0.2  | 0.55 | 0.05 | 0 | 1.00 | 30  | 50  | 3000 |
| 17 | AIP | 1   | 0   | 0   | 0    | 0.4 | 0.60 | 30  | 0.2  | 0.2  | 0.55 | 0.05 | 0 | 1.00 | 30  | 50  | 3000 |
| 18 | AIP | 1   | 0   | 0   | 0    | 0.5 | 0.50 | 30  | 0.2  | 0.2  | 0.55 | 0.05 | 0 | 1.00 | 30  | 50  | 3000 |
| 19 | SP  | 0.5 | 0.5 | 0   | 0    | 0   | 1.00 | 30  | 0.2  | 0.2  | 0.55 | 0.05 | 0 | 1.00 | 30  | 50  | 3000 |
| 20 | SP  | 0.3 | 0   | 0.7 | 0    | 0   | 1.00 | 30  | 0.2  | 0.2  | 0.55 | 0.05 | 0 | 1.00 | 30  | 50  | 3000 |
| 21 | SP  | 0   | 0.5 | 0.5 | 0    | 0   | 1.00 | 30  | 0.2  | 0.2  | 0.55 | 0.05 | 0 | 1.00 | 30  | 50  | 3000 |
| 22 | SP  | 0.5 | 0.5 | 0   | 0.05 | 0   | 0.95 | 30  | 0.2  | 0.2  | 0.55 | 0.05 | 0 | 1.00 | 30  | 50  | 3000 |
| 23 | SP  | 0.5 | 0.5 | 0   | 0.15 | 0   | 0.85 | 30  | 0.2  | 0.2  | 0.55 | 0.05 | 0 | 1.00 | 30  | 50  | 3000 |
| 24 | SP  | 0.5 | 0.5 | 0   | 0.3  | 0   | 0.70 | 30  | 0.2  | 0.2  | 0.55 | 0.05 | 0 | 1.00 | 30  | 50  | 3000 |
| 25 | SP  | 0.5 | 0.5 | 0   | 0.4  | 0   | 0.60 | 30  | 0.2  | 0.2  | 0.55 | 0.05 | 0 | 1.00 | 30  | 50  | 3000 |
| 4  |     | 1   | 0   | 0   | 0    | 0   | 1.00 | 3000 |     |      | なし  |      |   |      | 0   |     | 3000 |
| 5  |     | None |    |    |     |    |      | 0   | 0.25 | 0.1  | 0.65 | 0    | 0 | 1.00 | 3000 | 1  | 3000 |
| 1  |     | (Ti0.5Al0.5)N |  |  |  |  |  |  |  |  |  |  |  |  |  |  | 3000 |
| 2  |     | (Ti0.1Cr0.4Al0.5)N |  |  |  |  |  |  |  |  |  |  |  |  |  |  | 3000 |
| 3  |     | (Ti0.5Al0.5)N + MoS2 |  |  |  |  |  |  |  |  |  |  |  |  |  |  | 3000 |

SP: sputtering
AIP: arc ion plating
* If covering layer C is absent, covering layers A and B are formed such that the latter is in direct contact with the substrate and the former is top.

TABLE 2

| Nº | Film forming method | Layer A Composition (atomic ratio) |  |  |  |  |  |  | Thickness nm | Layer B Composition (atomic ratio) |  |  |  |  |  | Thickness nm | Number of layers | Total layer thickness nm |
|---|---|---|---|---|---|---|---|---|---|---|---|---|---|---|---|---|---|---|
|  |  | V | W | Mo | Nb | B | C | N |  | Ti | Cr | Al | Si | C | N |  |  |  |
| 26 | SP  | 0.3 | 0   | 0.7 | 0 | 0 | 0.2 | 0.80 | 30 | 0.2 | 0.2  | 0.55 | 0.05 | 0 | 1.00 | 30 | 50 | 3000 |
| 27 | SP  | 0.3 | 0   | 0.7 | 0 | 0 | 0.3 | 0.70 | 30 | 0.2 | 0.2  | 0.55 | 0.05 | 0 | 1.00 | 30 | 50 | 3000 |
| 28 | SP  | 0.3 | 0   | 0.7 | 0 | 0 | 0.5 | 0.50 | 30 | 0.2 | 0.2  | 0.55 | 0.05 | 0 | 1.00 | 30 | 50 | 3000 |
| 29 | SP  | 0.3 | 0   | 0.7 | 0 | 0 | 0.7 | 0.30 | 30 | 0.2 | 0.2  | 0.55 | 0.05 | 0 | 1.00 | 30 | 50 | 3000 |
| 30 | AIP | 0.8 | 0.2 | 0   | 0 | 0 | 0   | 1.00 | 30 | 0   | 0.4  | 0.6  | 0    | 0 | 1.00 | 30 | 50 | 3000 |
| 31 | AIP | 0.8 | 0.2 | 0   | 0 | 0 | 0   | 1.00 | 30 | 0.2 | 0.2  | 0.6  | 0    | 0 | 1.00 | 30 | 50 | 3000 |
| 32 | AIP | 0.8 | 0.2 | 0   | 0 | 0 | 0   | 1.00 | 30 | 0.3 | 0.1  | 0.6  | 0    | 0 | 1.00 | 30 | 50 | 3000 |
| 33 | AIP | 0.8 | 0.2 | 0   | 0 | 0 | 0   | 1.00 | 30 | 0.4 | 0.1  | 0.5  | 0    | 0 | 1.00 | 30 | 50 | 3000 |
| 34 | SP  | 0.4 | 0.2 | 0.4 | 0 | 0 | 0   | 1.00 | 40 | 0.2 | 0    | 0.8  | 0    | 0 | 1.00 | 40 | 37 | 3000 |
| 35 | SP  | 0.4 | 0.2 | 0.4 | 0 | 0 | 0   | 1.00 | 40 | 0.3 | 0.05 | 0.65 | 0    | 0 | 1.00 | 40 | 37 | 3000 |
| 36 | SP  | 0.4 | 0.2 | 0.4 | 0 | 0 | 0   | 1.00 | 40 | 0.2 | 0.25 | 0.55 | 0    | 0 | 1.00 | 40 | 37 | 3000 |
| 37 | SP  | 0.4 | 0.2 | 0.4 | 0 | 0 | 0   | 1.00 | 40 | 0.1 | 0.5  | 0.4  | 0    | 0 | 1.00 | 40 | 37 | 3000 |
| 38 | SP  | 0.4 | 0.2 | 0.4 | 0 | 0 | 0   | 1.00 | 40 | 0.1 | 0.7  | 0.2  | 0    | 0 | 1.00 | 40 | 37 | 3000 |
| 39 | SP  | 0.4 | 0.2 | 0.4 | 0 | 0 | 0   | 1.00 | 40 | 0.1 | 0.2  | 0.7  | 0    | 0 | 1.00 | 40 | 37 | 3000 |
| 40 | AIP | 0.9 | 0   | 0.1 | 0 | 0 | 0   | 1.00 | 35 | 0.2 | 0.2  | 0.6  | 0    | 0 | 1.00 | 40 | 40 | 3000 |
| 41 | AIP | 0.9 | 0   | 0.1 | 0 | 0 | 0   | 1.00 | 35 | 0.2 | 0.2  | 0.55 | 0.05 | 0 | 1.00 | 40 | 40 | 3000 |

TABLE 2-continued

| Nº | Film forming method | Layer A Composition (atomic ratio) | | | | | | | Thickness nm | Layer B Composition (atomic ratio) | | | | | | Thickness nm | Number of layers | Total layer thickness nm |
|---|---|---|---|---|---|---|---|---|---|---|---|---|---|---|---|---|---|---|
| | | V | W | Mo | Nb | B | C | N | | Ti | Cr | Al | Si | C | N | | | |
| 42 | AIP | 0.9 | 0 | 0.1 | 0 | 0 | 0 | 1.00 | 35 | 0.2 | 0.2 | 0.5 | 0.1 | 0 | 1.00 | 40 | 40 | 3000 |
| 43 | AIP | 0.9 | 0 | 0.1 | 0 | 0 | 0 | 1.00 | 35 | 0.15 | 0.2 | 0.5 | 0.15 | 0 | 1.00 | 40 | 40 | 3000 |
| 44 | AIP | 0.9 | 0 | 0.1 | 0 | 0 | 0 | 1.00 | 35 | 0.1 | 0.2 | 0.5 | 0.2 | 0 | 1.00 | 40 | 40 | 3000 |
| 45 | SP | 0 | 0.2 | 0.8 | 0 | 0 | 0 | 1.00 | 30 | 0.2 | 0.2 | 0.55 | 0.05 | 0.2 | 0.80 | 30 | 50 | 3000 |
| 46 | SP | 0 | 0.2 | 0.8 | 0 | 0 | 0 | 1.00 | 30 | 0.2 | 0.2 | 0.55 | 0.05 | 0.5 | 0.50 | 30 | 50 | 3000 |
| 47 | SP | 0 | 0.2 | 0.8 | 0 | 0 | 0 | 1.00 | 30 | 0.2 | 0.2 | 0.55 | 0.05 | 0.7 | 0.30 | 30 | 50 | 3000 |
| 48 | AIP | 0 | 0 | 0 | 1 | 0 | 0 | 1.00 | 25 | 0.2 | 0.2 | 0.55 | 0.05 | 0 | 1.00 | 20 | 66 | 3000 |
| 49 | AIP | 0.5 | 0 | 0 | 0.5 | 0 | 0 | 1.00 | 25 | 0.2 | 0.2 | 0.55 | 0.05 | 0 | 1.00 | 20 | 66 | 3000 |
| 50 | AIP | 0 | 0.5 | 0 | 0.5 | 0 | 0 | 1.00 | 25 | 0.2 | 0.2 | 0.55 | 0.05 | 0 | 1.00 | 20 | 66 | 3000 |

SP: sputtering
AIP: arc ion plating
* If covering layer C is absent, covering layers A and B are formed such that the former is in direct contact with the substrate and the latter is top.

TABLE 3

| Nº | Hardness GPa | Friction coefficient, after 300 m | Specific wear amount of film, 10E−10 mm3/Nm |
|---|---|---|---|
| 6 | 31 | 0.45 | 11.00 |
| 7 | 33 | 0.35 | 6.00 |
| 8 | 35 | 0.3 | 5.00 |
| 9 | 35 | 0.3 | 4.80 |
| 10 | 33 | 0.3 | 5.00 |
| 11 | 33 | 0.4 | 7.00 |
| 12 | 32 | 0.5 | 7.50 |
| 13 | 29 | 0.58 | 12.00 |
| 14 | 32 | 0.3 | 5.50 |
| 15 | 32 | 0.3 | 6.00 |
| 16 | 36 | 0.3 | 4.40 |
| 17 | 36 | 0.3 | 6.50 |
| 18 | 35 | 0.3 | 7.30 |
| 19 | 34 | 0.34 | 5.60 |
| 20 | 35 | 0.37 | 4.70 |
| 21 | 35 | 0.36 | 4.80 |
| 22 | 36 | 0.3 | 5.00 |
| 23 | 33 | 0.27 | 4.50 |
| 24 | 31 | 0.3 | 8.00 |
| 25 | 28 | 0.3 | 15.00 |
| 4 | 25 | 0.35 | 15.00 |
| 5 | 29 | 0.6 | 10.00 |
| 1 | 25 | 0.7 | 20.00 |
| 2 | 28 | 0.6 | 15.00 |
| 3 | 20 | 0.6 | 12.00 |

TABLE 4

| Nº | Hardness GPa | Friction coefficient, after 300 m | Specific wear amount of film, 10E−10 mm3/Nm |
|---|---|---|---|
| 26 | 36 | 0.38 | 4.40 |
| 27 | 35 | 0.4 | 4.20 |
| 28 | 32 | 0.45 | 7.50 |
| 29 | 29 | 0.58 | 13.00 |
| 30 | 33 | 0.34 | 4.50 |
| 31 | 35 | 0.37 | 5.20 |
| 32 | 33 | 0.39 | 6.40 |
| 33 | 31 | 0.45 | 15.00 |
| 34 | 28 | 0.4 | 17.00 |
| 35 | 31 | 0.42 | 7.50 |
| 36 | 35 | 0.34 | 4.50 |
| 37 | 30 | 0.4 | 6.00 |
| 38 | 27 | 0.45 | 13.00 |
| 39 | 36 | 0.37 | 4.10 |
| 40 | 33 | 0.4 | 5.50 |
| 41 | 36 | 0.37 | 3.90 |
| 42 | 34 | 0.37 | 3.70 |
| 43 | 33 | 0.4 | 6.50 |
| 44 | 29 | 0.45 | 14.00 |
| 45 | 36 | 0.35 | 3.00 |
| 46 | 33 | 0.33 | 5.00 |
| 47 | 27 | 0.32 | 11.00 |
| 48 | 35 | 0.45 | 4.20 |
| 49 | 33 | 0.4 | 4.50 |
| 50 | 33 | 0.47 | 5.10 |

TABLE 5

| Nº | Film forming method | Layer A Composition (atomic ratio) | | | | | | Thickness nm | Layer B Composition (atomic ratio) | | | | | | Thickness nm | Number of layers | Total layer thickness nm |
|---|---|---|---|---|---|---|---|---|---|---|---|---|---|---|---|---|---|
| | | V | W | Mo | B | C | N | | Ti | Cr | Al | Si | C | N | | | |
| 6a | AIP | 1 | 0 | 0 | 0 | 0 | 1.00 | 30 | 0 | 0.4 | 0.6 | 0 | 0 | 1.00 | 30 | 50 | 3000 |
| 7a | AIP | 1 | 0 | 0 | 0 | 0 | 1.00 | 30 | 0.2 | 0.2 | 0.6 | 0 | 0 | 1.00 | 30 | 50 | 3000 |
| 8a | AIP | 1 | 0 | 0 | 0 | 0 | 1.00 | 30 | 0.3 | 0.1 | 0.6 | 0 | 0 | 1.00 | 30 | 50 | 3000 |
| 9a | AIP | 1 | 0 | 0 | 0 | 0 | 1.00 | 30 | 0.4 | 0.1 | 0.5 | 0 | 0 | 1.00 | 30 | 50 | 3000 |
| 10a | AIP | 1 | 0 | 0 | 0 | 0 | 1.00 | 30 | 0.2 | 0 | 0.8 | 0 | 0 | 1.00 | 30 | 50 | 3000 |
| 11a | AIP | 1 | 0 | 0 | 0 | 0 | 1.00 | 30 | 0.3 | 0.05 | 0.65 | 0 | 0 | 1.00 | 30 | 50 | 3000 |
| 12a | AIP | 1 | 0 | 0 | 0 | 0 | 1.00 | 30 | 0.2 | 0.25 | 0.55 | 0 | 0 | 1.00 | 30 | 50 | 3000 |
| 13a | AIP | 1 | 0 | 0 | 0 | 0 | 1.00 | 30 | 0.1 | 0.5 | 0.4 | 0 | 0 | 1.00 | 30 | 50 | 3000 |
| 14a | AIP | 1 | 0 | 0 | 0 | 0 | 1.00 | 30 | 0.3 | 0.3 | 0.4 | 0 | 0 | 1.00 | 30 | 50 | 3000 |
| 15a | AIP | 1 | 0 | 0 | 0 | 0 | 1.00 | 30 | 0.25 | 0.25 | 0.5 | 0 | 0 | 1.00 | 30 | 50 | 3000 |
| 16a | AIP | 1 | 0 | 0 | 0 | 0 | 1.00 | 30 | 0.2 | 0.2 | 0.6 | 0 | 0 | 1.00 | 30 | 50 | 3000 |
| 17a | AIP | 1 | 0 | 0 | 0 | 0 | 1.00 | 30 | 0.1 | 0.2 | 0.7 | 0 | 0 | 1.00 | 30 | 50 | 3000 |

TABLE 5-continued

| Nº | Film forming method | Layer A Composition (atomic ratio) | | | | | | Thickness nm | Layer B Composition (atomic ratio) | | | | | | Thickness nm | Number of layers | Total layer thickness nm |
|---|---|---|---|---|---|---|---|---|---|---|---|---|---|---|---|---|---|
| | | V | W | Mo | B | C | N | | Ti | Cr | Al | Si | C | N | | | |
| 18a | AIP | 1 | 0 | 0 | 0 | 0 | 1.00 | 30 | 0.2 | 0.2 | 0.6 | 0 | 0 | 1.00 | 30 | 50 | 3000 |
| 19a | AIP | 1 | 0 | 0 | 0 | 0 | 1.00 | 30 | 0.2 | 0.2 | 0.55 | 0.05 | 0 | 1.00 | 30 | 50 | 3000 |
| 20a | AIP | 1 | 0 | 0 | 0 | 0 | 1.00 | 30 | 0.2 | 0.2 | 0.5 | 0.1 | 0 | 1.00 | 30 | 50 | 3000 |
| 21a | AIP | 1 | 0 | 0 | 0 | 0 | 1.00 | 30 | 0.15 | 0.2 | 0.5 | 0.15 | 0 | 1.00 | 30 | 50 | 3000 |
| 4a | | 1 | 0 | 0 | 0 | 0 | 1.00 | 3000 | None | | | | | | 0 | | 3000 |
| 1a | | (Ti0.5Al0.5)N | | | | | | | | | | | | | | | 3000 |
| 2a | | (Ti0.1Cr0.4Al0.5)N | | | | | | | | | | | | | | | 3000 |
| 3a | | (Ti0.5Al0.5)N + MoS2 | | | | | | | | | | | | | | | 3000 |

SP: sputtering
AIP: arc ion plating
* If covering layer C is absent, covering layers A and B are formed such that the latter is in direct contact with the substrate and the former is top.

TABLE 6

| No. | Hardness GPa | Friction coefficient, after 300 m | Specific wear amount of film, 10E−10 mm3/Nm |
|---|---|---|---|
| 6a | 31 | 0.34 | 7.50 |
| 7a | 35 | 0.37 | 5.20 |
| 8a | 33 | 0.39 | 4.50 |
| 9a | 31 | 0.45 | 15.00 |
| 10a | 28 | 0.4 | 17.00 |
| 11a | 31 | 0.34 | 5.50 |
| 12a | 35 | 0.34 | 4.00 |
| 13a | 30 | 0.4 | 6.00 |
| 14a | 31 | 0.4 | 6.50 |
| 15a | 34 | 0.42 | 4.00 |
| 16a | 36 | 0.37 | 2.50 |
| 17a | 36 | 0.37 | 3.50 |
| 18a | 33 | 0.4 | 5.50 |
| 19a | 36 | 0.37 | 2.70 |
| 20a | 34 | 0.37 | 3.70 |
| 21a | 33 | 0.4 | 6.50 |
| 4a | 25 | 0.35 | 15.00 |
| 1a | 25 | 0.7 | 20.00 |
| 2a | 28 | 0.6 | 15.00 |
| 3a | 20 | 0.6 | 12.00 |

TABLE 7

| Nº | Underlying layer Composition | Thickness nm | Layer A Composition | Thickness nm | Layer B Composition | Thickness nm | Number of layer | Seizure load, N |
|---|---|---|---|---|---|---|---|---|
| 1c | なし | 0 | VN | 30 | (Ti0.2Cr0.2Al0.55Si0.05)N | 30 | 50 | 600 |
| 2c | (Cr0.8W0.2)N | 3000 | VN | 30 | (Ti0.2Cr0.2Al0.55Si0.05)N | 30 | 50 | 600 |
| 3c | (Cr0.8W0.2)N | 5000 | VN | 30 | (Ti0.2Cr0.2Al0.55Si0.05)N | 30 | 50 | 800 |
| 4c | (Cr0.8W0.2)N | 7000 | VN | 30 | (Ti0.2Cr0.2Al0.55Si0.05)N | 30 | 50 | 900 |
| 5c | (Cr0.8W0.2)N | 10000 | VN | 30 | (Ti0.2Cr0.2Al0.55Si0.05)N | 30 | 50 | >1000 |
| 6c | (Cr0.8W0.2)N | 15000 | VN | 30 | (Ti0.2Cr0.2Al0.55Si0.05)N | 30 | 50 | >1000 |
| 7c | CrN | 10000 | VN | 30 | (Ti0.2Cr0.2Al0.55Si0.05)N | 30 | 50 | 900 |
| 8c | (Cr0.8Al0.2)N | 10000 | VN | 30 | (Ti0.2Cr0.2Al0.55Si0.05)N | 30 | 50 | >1000 |
| 9c | (Cr0.8Ti0.2)N | 10000 | VN | 30 | (Ti0.2Cr0.2Al0.55Si0.05)N | 30 | 50 | >1000 |
| 10c | (Cr0.8Mo0.2)N | 10000 | VN | 30 | (Ti0.2Cr0.2Al0.55Si0.05)N | 30 | 50 | >1000 |
| 11c | (Cr0.8Nb0.2)N | 10000 | VN | 30 | (Ti0.2Cr0.2Al0.55Si0.05)N | 30 | 50 | 900 |
| 12c | (Cr0.8Si0.2)N | 10000 | VN | 30 | (Ti0.2Cr0.2Al0.55Si0.05)N | 30 | 50 | 900 |

TABLE 8

| Nº | Film forming method | Layer A Composition (atomic ratio) | | | | | | | Thickness nm | Layer B Composition (atomic ratio) | | | | | | Thickness nm | Number of layers | Total layer thickness nm |
|---|---|---|---|---|---|---|---|---|---|---|---|---|---|---|---|---|---|---|
| | | V | W | Mo | Nb | B | C | N | | Ti | Cr | Al | Si | C | N | | | |
| 1d | AIP | 0 | 0 | 0 | 1 | 0 | 0 | 1 | 1 | 0.2 | 0.2 | 0.55 | 0.05 | 0 | 1.00 | 1 | 1500 | 3000 |
| 2d | AIP | 0 | 0 | 0 | 1 | 0 | 0 | 1 | 10 | 0.2 | 0.2 | 0.55 | 0.05 | 0 | 1.00 | 10 | 150 | 3000 |
| 3d | AIP | 0 | 0 | 0 | 1 | 0 | 0 | 1 | 25 | 0.2 | 0.2 | 0.55 | 0.05 | 0 | 1.00 | 25 | 60 | 3000 |
| 4d | AIP | 0 | 0 | 0 | 1 | 0 | 0 | 1 | 80 | 0.2 | 0.2 | 0.55 | 0.05 | 0 | 1.00 | 80 | 18 | 3000 |
| 5d | AIP | 0 | 0 | 0 | 1 | 0 | 0 | 1 | 100 | 0.2 | 0.2 | 0.55 | 0.05 | 0 | 1.00 | 100 | 15 | 3000 |
| 6d | AIP | 0 | 0 | 0 | 1 | 0 | 0 | 1 | 150 | 0.2 | 0.2 | 0.55 | 0.05 | 0 | 1.00 | 150 | 10 | 3000 |
| 7d | AIP | 1 | 0 | 0 | 0 | 0 | 0 | 1 | 25 | 0.2 | 0 | 0.8 | 0 | 0 | 1.00 | 25 | 60 | 3000 |
| 8d | AIP | 1 | 0 | 0 | 0 | 0 | 0 | 1 | 25 | 0.3 | 0 | 0.7 | 0 | 0 | 1.00 | 25 | 60 | 3000 |
| 9d | AIP | 1 | 0 | 0 | 0 | 0 | 0 | 1 | 25 | 0.5 | 0 | 0.5 | 0 | 0 | 1.00 | 25 | 60 | 3000 |

TABLE 8-continued

| Film forming N° | method | Layer A Composition (atomic ratio) | | | | | | | Thickness nm | Layer B Composition (atomic ratio) | | | | | | Thickness nm | Number of layers | Total layer thickness nm |
|---|---|---|---|---|---|---|---|---|---|---|---|---|---|---|---|---|---|---|
| | | V | W | Mo | Nb | B | C | N | | Ti | Cr | Al | Si | C | N | | | |
| 10d | AIP | 1 | 0 | 0 | 0 | 0 | 0 | 1 | 25 | 0.6 | 0 | 0.4 | 0 | 0 | 1.00 | 25 | 60 | 3000 |
| 11d | AIP | 1 | 0 | 0 | 0 | 0 | 0 | 1 | 25 | 0.4 | 0 | 0.55 | 0.05 | 0 | 1.00 | 25 | 60 | 3000 |

TABLE 9

| N° | Hardness GPa | Friction coefficient, after 300 m | Specific wear amount of film, ×10E−10 mm3/Nm |
|---|---|---|---|
| 1d | 29 | 0.4 | 11 |
| 2d | 36 | 0.4 | 5.3 |
| 3d | 37 | 0.4 | 3 |
| 4d | 35 | 0.4 | 4.3 |
| 5d | 34 | 0.45 | 6.7 |
| 6d | 28 | 0.5 | 12.5 |
| 7d | 28 | 0.55 | 13 |
| 8d | 33 | 0.37 | 5.6 |
| 9d | 34 | 0.35 | 6.1 |
| 10d | 29 | 0.51 | 11 |
| 11d | 35 | 0.35 | 4.3 |

Incidentally, samples in Examples 1 to 4 were prepared in such a way that the covering layer B is formed first (on the substrate) and the covering layer A is formed last, and samples in Example 4 were prepared in such a way that the covering layer B is formed first (on the covering layer C) and the covering layer A is formed last. However, the arrangement of the covering layers A and B may be reversed or changed such that both the first and last layers are the covering layers A or the covering layers B. The covering layers arranged in any manner produce the same effect as mentioned above.

The hard film according to the present invention excels conventional surface coating film in wear resistance and sliding performance (due to low friction coefficient), and hence it finds application to molds and jigs for their improvement in durability.

It should be understood by those skilled in the art that various modifications, combinations, sub-combinations, and alternations may occur depending on the design requirements and other factors insofar as they are within the scope and spirit of the appended claims or the equivalents thereof.

What is claimed is:

1. A mold comprising
a steel substrate;
a hard film on the steel substrate; and
a covering layer C between the steel substrate and the hard film, wherein
the hard film comprises at least one covering layer A and at least one covering layer B stacked one over the other;
each covering layer A and each covering layer B has a thickness in a range of from 5 to 100 nm;
the covering layer C is thicker than 5 μm;
each covering layer A has a composition represented by the formula $M(B_a C_b N_{1-a-b})$ where M denotes one or more elements selected from the group consisting of W, V, Mo, and Nb, $0 \leq a \leq 0.3$, and $0 \leq b \leq 0.5$;
each covering layer B has a composition represented by the formula $Ti_{1-x-y-z}Cr_x Al_y Si_z (C_{1-A} N_A)$ where $0 \leq 1-x-y-z \leq 0.5$, $0 \leq x \leq 0.5$, $0.4 \leq y \leq 0.7$, $0 \leq z \leq 0.15$, and $0.5 \leq A \leq 1$; and
the covering layer C has a composition represented by the formula $(Cr_d M_{1-d})(Cr_{1-e} N_e)$ where M denotes one or more elements selected from the group consisting of Ti, Al, Nb, W, Mo, and Si, $0.2 \leq d \leq 1$, and $0 \leq e \leq 1$.

2. The mold as defined in claim 1, wherein each covering layer A comprises V as M and does not contain B (a=0); and each covering layer B has $0 \leq 1-x-y-z \leq 0.3$, $0.1 \leq x \leq 0.3$, $0.5 \leq y \leq 0.7$, z=0, and

A=1.

3. The mold as defined in claim 1, wherein each covering layer A comprises V as M and does not contain B (a=0); and each covering layer B has $0 \leq 1-x-y-z \leq 0.3$, $0.1 \leq x \leq 0.3$, $0.5 \leq y \leq 0.65$, $0.01 \leq z \leq 0.1$, and

A=1.

4. The mold as defined in claim 1, wherein $0.05 \leq a < 0.3$.
5. The mold as defined in claim 1, wherein $0.1 \leq a < 0.2$.
6. The mold as defined in claim 1, wherein $0.05 \leq b 0.5$.
7. The mold as defined in claim 1, wherein $0.05 \leq b 0.3$.
8. The mold as defined in claim 1, wherein the hard film comprises a total number of layers larger than 10.
9. The mold as defined in claim 1, wherein the hard film has a thickness in a range of from 0.1 μm to 20 μm.
10. The mold as defined in Claim 1, wherein a total thickness of the covering layer C and the hard film is larger than 10 μm.
11. The mold as defined in claim 1, wherein
the at least one covering layer A comprises a first covering layer A and a second covering layer A;
the at least one covering layer B comprises a first covering layer B and a second covering layer B; and
the first covering layer A, the second covering layer A, the first covering layer B and the second covering layer B are stacked in a structure consisting of, in order, the first covering layer A, the first covering layer B, the second covering layer A, and the second covering layer B.

12. The mold as defined in claim 1, wherein each covering layer A has a composition represented by the formula $$M(B_aC_bN_{1-a-b})$$

where M denotes one or more elements selected from the group consisting of V, Mo, and Nb, $0 \leq a \leq 0.3$, and $0 \leq b \leq 0.5$.

13. The mold as defined in claim 1, wherein each covering layer B has a composition represented by the formula $$Ti_{1-x-y-z}Cr_xAl_ySi_z(C_{1-W}N_W)$$

where $0 \leq 1-x-y-z \leq 0.5$, $0 \leq x \leq 0.5$, $0.4 \leq y \leq 0.7$, $0 \leq z \leq 0.15$, and $0.5 \leq W \leq 1$.

14. The mold as defined in claim 1, wherein each of the covering layer A and the covering layer B has a thickness in a range of from 5 to 80 nm.

15. The mold as defined in claim 1, wherein each of the covering layer A and the covering layer B has a thickness in a range of from 20 to 80 nm.

16. The mold as defined in claim 1, wherein the mold has a specific wear amount of from $4.50 \times 10^{-10}$ mm$^3$/Nm to $11.00 \times 10^{-10}$ mm$^3$ Nm.

17. The mold as defined in claim 1, wherein the mold has a seizure property of 800 N or more.

* * * * *